United States Patent [19]

Matsuura et al.

[11] Patent Number: 5,286,966
[45] Date of Patent: Feb. 15, 1994

[54] FREQUENCY STABILIZED LIGHT SOURCE

[75] Inventors: Satohi Matsuura; Tekken Ri, both of Tokyo; Tsuneo Horiguchi; Mitsuhiro Tateda, both of Mito, all of Japan

[73] Assignee: Ando Electric Co., Ltd., Tokyo, Japan

[21] Appl. No.: 878,945

[22] Filed: May 5, 1992

[30] Foreign Application Priority Data

May 10, 1991 [JP] Japan .................. 3-133319

[51] Int. Cl.[5] .................. G01J 1/32
[52] U.S. Cl. .................. 250/205; 372/32
[58] Field of Search .................. 250/205; 372/32; 307/520, 543, 556; 356/5, 349; 315/279, 282

[56] References Cited

U.S. PATENT DOCUMENTS

| | | | |
|---|---|---|---|
| 4,583,228 | 4/1986 | Brown et al. | 372/32 |
| 4,947,398 | 8/1990 | Yasuda et al. | 372/32 |
| 5,068,864 | 11/1991 | Javan | 372/32 |
| 5,119,391 | 6/1992 | Maeda et al. | 372/32 |

Primary Examiner—David C. Nelms
Assistant Examiner—K. Shami
Attorney, Agent, or Firm—Seidel, Gonda, Lavorgna & Monaco

[57] ABSTRACT

A light source which is stabilized in frequencies at uniform intervals comprises a light source 5 whose light frequency is varied with a signal from a reference signal source 4; a frequency detector 6 for detecting the frequency of the output of the light source 5, the cycles of the said frequency detector being the same as the uniform intervals; a comparator 2 for comparing the output of the frequency detector 6 and the output of the reference light source 1; and a switch 3 having as its input the output of the comparator 2 for inputting the output to the light source 5, said switch being so operated that when the frequency of the light source 5 is to be changed the switch is opened and the output of the reference signal source 4 is changed to set the output frequency of the light source 5 near the desired frequency and then the switch 3 is closed.

2 Claims, 4 Drawing Sheets

FREQUENCY STABILIZED LIGHT SOURCE

BACKGROUND OF THE INVENTION

1. Field of the Invention

The present invention relates to a frequency stabilized light source, and more particularly, relates to a frequency stabilized light source for generating frequencies spaced at predetermined intervals, such as local oscillation lights on the side of a receiver.

In coherent light communication, a frequency multiplexing may be utilized in which a number of signals having carrier frequencies are spaced at uniform intervals. In such communication system, in order to perform heterodyne (or homodyne) detection on the receiver side, a local oscillation light source having the same frequency intervals as those on the transmitter side is utilized.

The present invention provides a frequency stabilized light source having frequencies spaced at uniform intervals which can be used, for example, as a localized oscillation light source on the side of a receiver.

2. Prior Art

A construction of the conventional frequency stabilized light source will be first explained in reference to FIG. 5. In this figure, 1 is a reference signal source, 2 is a comparator, 5 is a light source and 6 is a frequency detector. The change in frequency of the light from the light source 5 is detected by the frequency detector 6 and is compared with the reference signal from the reference signal source 1. The comparator 2 detects the frequency deviation of the light source 3 which is fed back to the light source to stabilize it.

As the frequency detector 6, a Fabry-Perot interferometer or a gas absorption spectrometer is chiefly used. The curve 31 of FIG. 6 shows a detection profile of the Fabry-Perot interferometer and the curve 41 of FIG. 8 shows a detection profile of the gas spectrometer. In the former case, the point 33 on the profile of FIG. 6 is selected as a detection point and, in the latter case, the point 43 of FIG. 8 is selected as a detection point. However, the detection property of many frequency detectors 6 is obtained in a very restricted frequency range. For example, in the Fabry-Perot interference meter, only the range between the points 32 and 34 in FIG. 6 is available for a detector and in the gas spectrometer only the range between the points 42 and 44 in FIG. 8 is usable for a detector.

The frequency of the light source 5 in FIG. 5 can be varied by adjusting the light source 5 and the frequency detector 6. In the case of Fabry-Perot interference meter as the frequency detector 6, the detection property is adjusted to have a property as expressed by a curve 36 in FIG. 7 by controlling the conditions such as interference distance, refractive index, temperature and pressure, so that the point 33 in FIG. 6 is shifted to the point 37 in FIG. 7. In the case of gas spectrometer, the detection property is adjusted to have a detection property as expressed by the curve 46 in FIG. 9 so that the point 43 in FIG. 8 is shifted to the point 47 in FIG. 9.

PROBLEMS TO BE SOLVED BY THE INVENTION

In order to obtain a high stability in the frequency, a frequency detector 6 whose property is stable in, in other words, insensitive to, the use and environmental conditions is employed. Accordingly, in order to manipulate or adjust the frequency detector 6 an extensive variation in the use and environmental conditions must be introduced. Further, to obtain a frequency stability, the use and environmental conditions must be highly stabilized after the frequency has been changed. Thus, not only a great amount of energy is required to change the use and environmental conditions to a great extent but also a long period of time is required before it is stabilized.

OBJECTS OF THE INVENTION

A principal object of the invention is to provide a frequency stabilized light source, whose frequency can be changed quickly with a saved energy.

Another object of the invention is to provide a frequency stabilized light source, in which the stabilized frequency can be quickly changed with a saved energy in case the cycles of the detection profile of the frequency detector are slightly different from the intervals of the frequencies to be stabilized, by using together a small change in a reference signal source for the feedback circuit.

BRIEF SUMMARY OF THE INVENTION

To achieve these objects, according to the first aspect of the invention, a frequency stabilized light source which is stabilized at frequencies at uniform intervals comprises a light source 5 whose light frequency is varied with a signal from a reference signal source 4; a frequency detector 6 for detecting the frequency of the output of the light source 5, the cycles of the said frequency detector being the same as the uniform intervals; a comparator 2 for comparing the output of the frequency detector 6 and the output of the reference signal source 1; and a switch 3 having as its input the output of the comparator 2 for inputting the output to the light source 5, said switch being so operated that when the frequency of the light source 5 is to be changed the switch is opened and the output of the reference signal source 4 is changed to set the output frequency of the light source 5 near the desired frequency and then the switch 3 is closed.

According to the second aspect of the invention, in a frequency stabilized light source which is stabilized at frequencies of uniform intervals comprises a light source 5 whose light frequency is varied with a signal from a reference signal source 4; a frequency detector 6 for detecting the frequency of the output of the light source 5, the cycles of the said frequency detector being slightly different from the uniform intervals; a comparator 2 for comparing the output of the frequency detector 6 and the output of the reference signal source 1; and a switch 3 having as its input the output of the comparator 2 for inputting the output to the light source 5, said switch being so operated that when the frequency of the light source 5 is to be changed the switch is opened and the output signal of the reference signal source 4 is changed to set the output frequency of the light source 5 near the desired frequency and then the switch 3 is closed and the reference signal source 1 is finely adjusted.

DESCRIPTION OF A PREFERRED EMBODIMENT OF THE INVENTION

Figure 1:
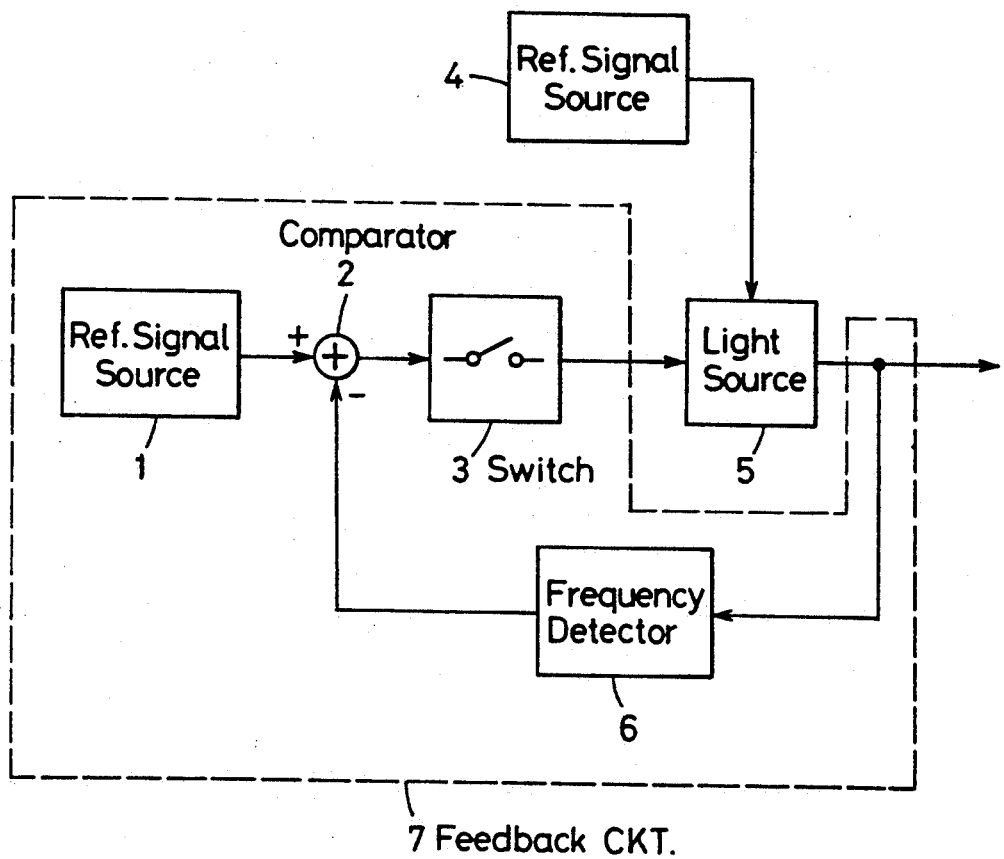
FIG. 1 shows a construction of a frequency stabilized light source according to the present invention.

Referring to FIG. 1, a frequency stabilized light source according to the first embodiment of the present invention is illustrated. In this figure, the various elements are the same as those illustrated in FIG. 2 except that a switch 3 and a reference signal source 4 are further employed. A feed back loop is formed by the reference signal source 1, the comparator 2, switch 3 and a frequency detector 6.

Figure 2:
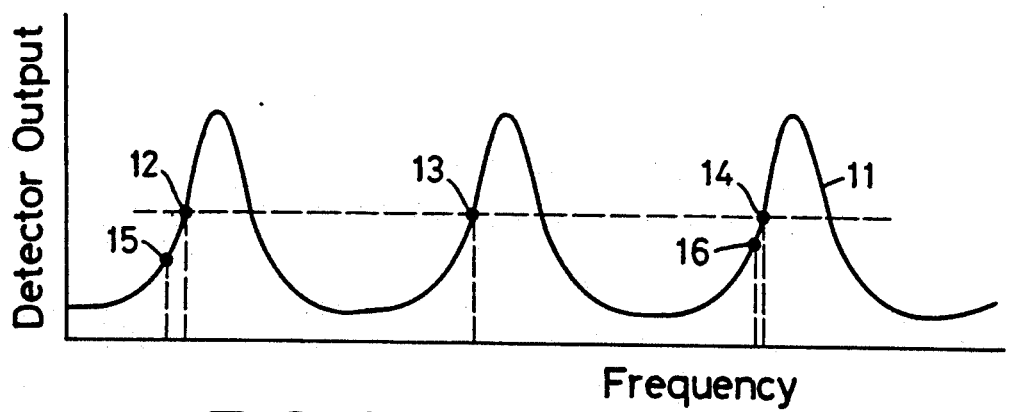
FIG. 2 shows an explanatory diagram of the function of the frequency stabilization according to the first embodiment of the present invention.

FIG. 2 shows a detection profile of Fabry-Perot interferometer used as the frequency detector 6 and the points 12, 13 and 14 are the frequencies which are to be stabilized.

In operation, it is assumed that when the switch 3 is opened, the light frequency of the light source 5 is at the point 15 in FIG. 2, and the reference signal source 1 is generating such a signal that the output of the comparator 2 is zero when the light source 5 is generating a light of a frequency at the point 12. When the switch 3 is closed the output frequency of the light source 5 is sensed by the frequency detector 6 and is compared with the reference frequency from the reference signal source 1. The frequency deviation from the point 12 is fed back to the light source 5 and the output frequency of the light source 5 is thus stabilized at the point 12.

Next, the case where the frequency is changed from the point 12 to the point 14 in FIG. 2. In the first embodiment, the response of the feedback circuit 7 remains the same in the vicinity of the points 12, 13 and 14 because the cycles of the detection profile of the frequency detector 6 are the same as the intervals of the frequencies to be stabilized. Accordingly, by opening the switch 3 and changing the output signal of the reference signal source 4 to set the output frequency of the light 5 at the point 16 and then closing the switch 3, the output frequency of the light source 5 is stabilized at the point 14 without manipulating the frequency detector 6, just as the case where the output of the light source 5 is changed from the point 12 to the point 15 as previously described.

Figure 3:
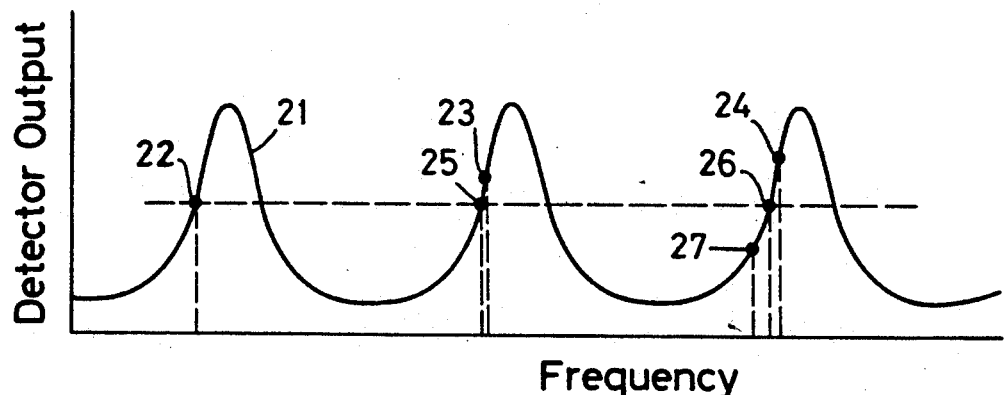
FIG. 3 shows an explanatory diagram of the function of the frequency stabilization according to the second embodiment of the present invention.

Next, a principle of the second embodiment according to the present invention will be described in connection with FIG. 3. The frequency detection profile has frequency intervals which are slightly different from those of the frequencies to be stabilized. 21 of FIG. 3 is a detection profile obtained by using Fabry-Perot interferometer and the points 22, 23, and 24 in FIG. 3 indicate the frequencies to be stabilized.

Next, the case where the frequency is changed from the point 22 to the point 24. Since the cycles of the frequency detector are the same as the frequency intervals between the points 22, 25 and 26, the response of the feedback circuit 7 is the same in the vicinity of the points 22, 25 and 26. Accordingly, when the switch 3 is opened and the output signal of the reference signal source 4 is changed to set the output of the light source 5 at the point 27 and thereafter the switch 3 is closed, the output frequency of the light source 5 is stabilized to the point 26 without manipulating the frequency detector 6.

In this condition, when the reference signal source 1 is changed, the output frequency of the light source 5 is varied according to this change, it is possible to set the output frequency at the point 24 by checking beforehand the magnitude of the output of the reference signal where the output frequency is at the point 25 and controlling the reference signal source 1 to this magnitude, the output frequency of the light source 5 is set at 24.

Figure 4:
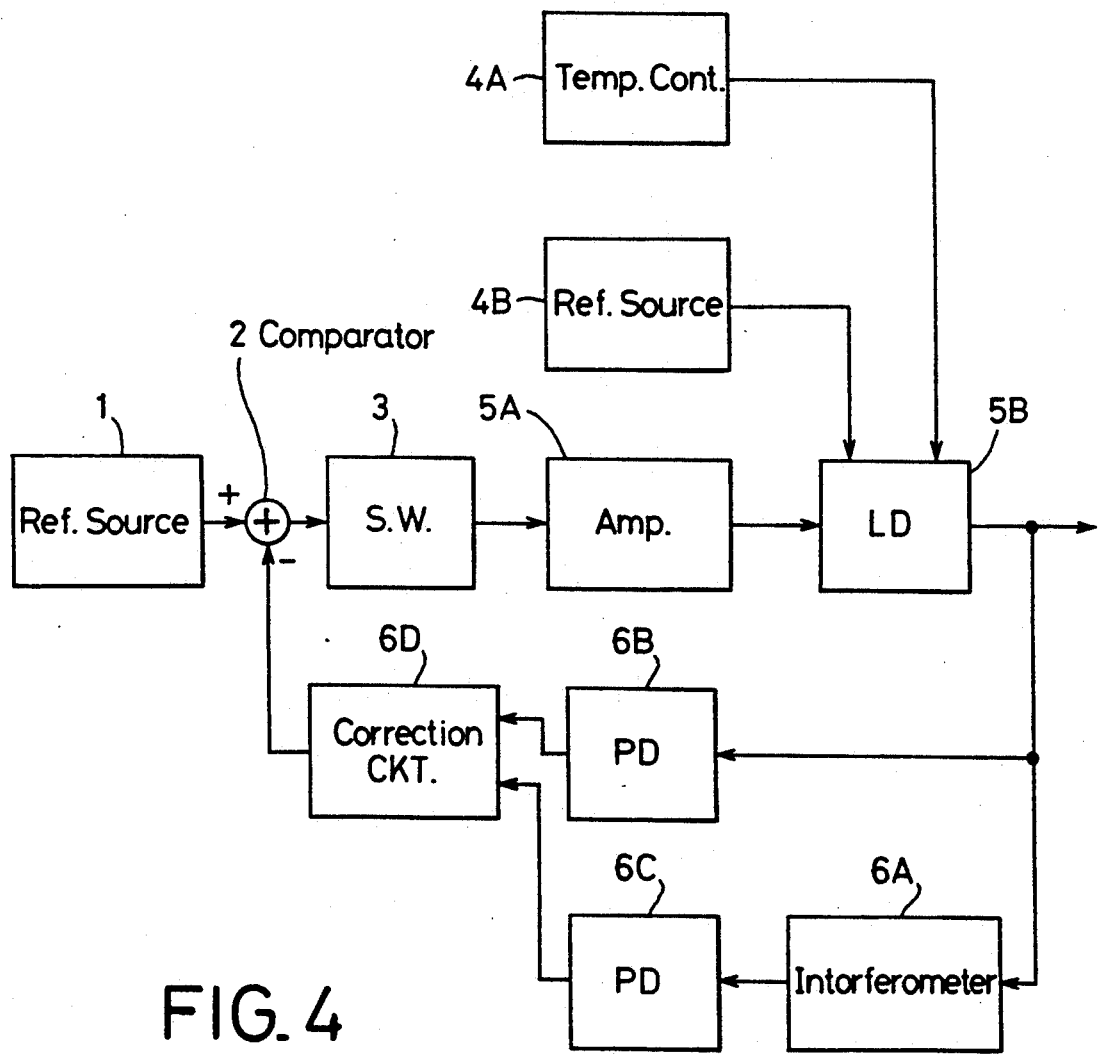
FIG. 4 illustrates a specific embodiment of the frequency stabilized light source according to the present invention.
Figure 5:
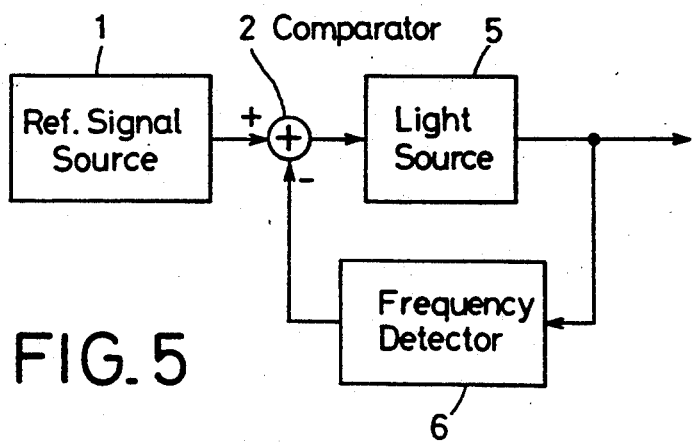
FIG. 5 shows a construction of a frequency stabilized light source according to the conventional technique.
Figure 6:
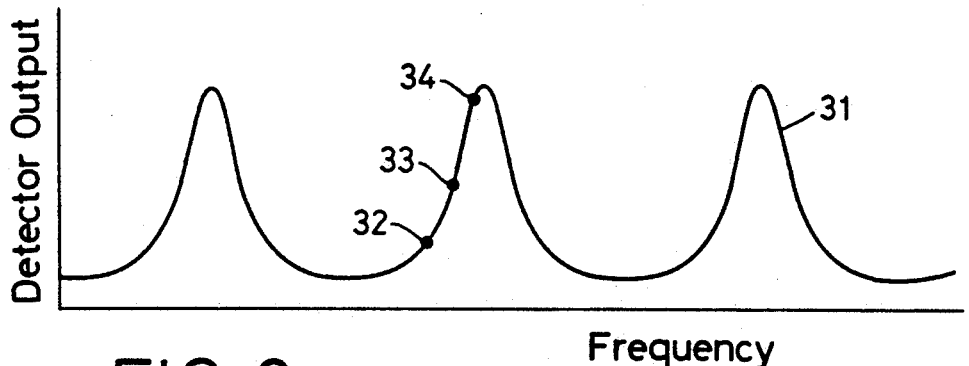
FIGS. 6, 7, 8 and 9 are explanatory diagrams for explaining the function of the light source of FIG. 5.
Figure 7:
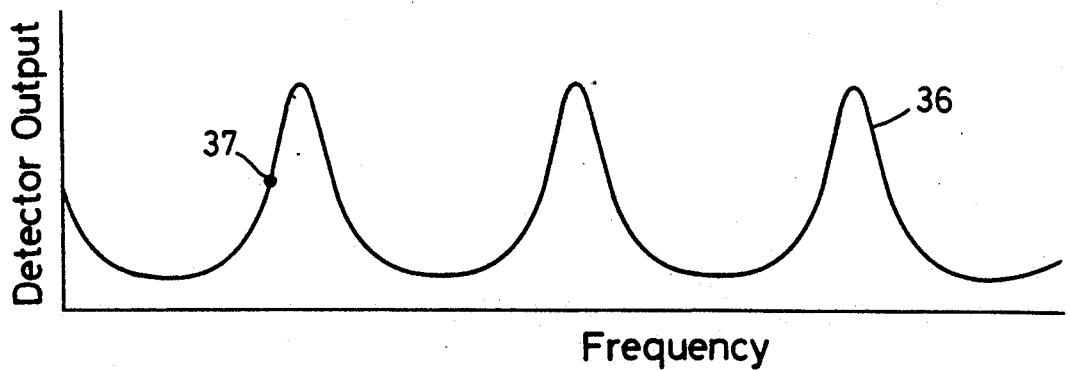
Figure 8:
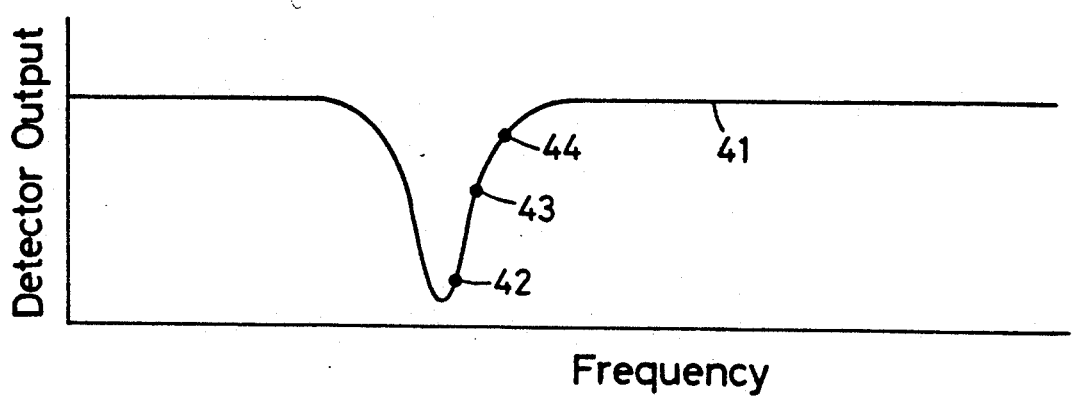
Figure 9:
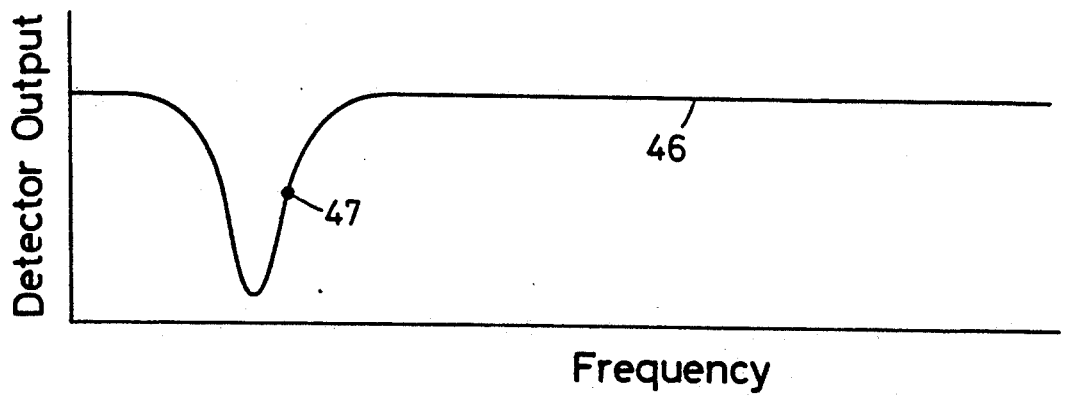

A more specific embodiment of the first embodiment of the present invention is illustrated in FIG. 4 wherein 4A is a temperature control circuit, 4B is a reference electric source. 5A is an amplifier, 5B is a laser diode (LD), 6A is a Fabry-Perot interferometer used as a frequency detector, 6B and 6C are photodiodes (PDs) and 6D is a correction circuit. The other elements are the same as those illustrated in FIG. 1. The temperature control circuit 4A and the reference signal source 4B form together a reference signal source 4, the amplifier 5A and the LD 5B constitute a light source 5, the interferometer 6A, the PD 6B, the PD 6C and the correction circuit 6D form a frequency detector. The temperature control circuit 4A sets the temperature of the LD 5B and the reference signal source 4B sets a rough output frequency of the LD 5B.

A portion of the light from the LD 5B passes through the interferometer 6A where the variation of the frequency is converted into a variation of a level. The output of the LD 5B is converted into an electric signal and the output of the interferometer 6A into an electric signal by the PD 6B. Both outputs of the PD 6B and PD 6C are inputted to the correction circuit 6D. This correction circuit 6D is used for removing the level variation of the LD 5B from the output of the interferometer 6A and sends only the information on the frequency of the LD 5B to the comparator 2.

The comparator 2 compares the reference electric source 1 with the output of the correction circuit 6D to detect the deviation of the LD 5B from the stabilized frequency and upon closing the switch 3, the deviation is negatively fed back to the LD 5B through the amplifier 5A to stabilize the frequency.

For example, it is assumed that the frequencies to be stabilized are 200 THz, 200.01 THz and 200.03 THz, and the detection frequency of the interferometer 6A is 10 GHz. It is also assumed that the LD 5B is temperature controlled to 25° C. and the output frequency prior to the frequency-stabilization is 200.0001 THz. Under these conditions, when the switch 3 is closed from its open condition, the output frequency of the LD 5B becomes stabilized at 200 THz.

Then, when the switch 3 is opened from its closed condition, the output frequency of the LD 5B returns to 200.001 THz. If it is assumed that the LD 5B has a frequency sensitivity of −10 GHz/°C., the output frequency of the LD 5B becomes 200.0201 THz. When the switch 3 is closed from its open condition, the output frequency of the LD 5B becomes stabilized at 200.02 THz. As the LD 5B is small both in size and heat capacity, the temperature can be swiftly changed and as a result the frequency switching is also made quickly.

The second embodiment of the present invention is such a case where the detection frequency of the interferometer is 9.9 GHz. In this case, even if the LD 5B is adjusted to be stabilized to 200 THz, when the switch 3 is closed at a temperature of 23° C., the frequency becomes 200.0198 THz. Here, the reference signal source 1 is finely changed so that the output frequency becomes 200.02 YHz. This change must be obtained beforehand. Thus, even if the frequency of the detection frequency of the interferometer and the frequency to be stabilized are slightly different, a quick stabilization can be achieved without manipulating the frequency detector.

According to the present invention, by using the same cycles of the frequency detector as the intervals of the frequencies to be stabilized, the stabilized frequency can be quickly changed with saved energy. Further, when the cycles of the frequency detector are slightly different from the intervals of the frequencies to be stabilized, the stabilized frequency can be quickly changed with saved energy by using together a slight variation of the reference signal source of the feedback circuit.

We claim:

1. A frequency stabilized light source which is stabilized by frequencies of uniform intervals comprises:
   a light source 5 whose light frequency is varied with a signal from a reference signal source 4;
   a frequency detector 6 for detecting the frequency of the output of the light source 5, cycles of the said frequency detector being the same as said uniform intervals;
   a comparator 2 for comparing the output of the frequency detector 6 with the output of a reference signal source 1; and
   a switch 3 having as its input the output of its comparator 2 for inputting the output to the light source 5, said switch being so operated that when the frequency of the light source 5 is to be changed the switch is opened and the output of the reference signal source 4 is changed to set the output frequency of the light source 5 near the desired frequency and then the switch 3 is closed.

2. A frequency stabilized light source which is stabilized by frequencies of uniform intervals comprises a light source 5 whose light frequency is varied with a signal from a reference signal source 4;
   a frequency detector 6 for detecting the frequency of the output of the light source 5, cycles of the said frequency detector being slightly different from said uniform intervals;
   a comparator 2 for comparing the output of the frequency detector 6 with the output of reference signal source 1; and
   a switch 3 having as its input the output of the comparator 2 for inputting the output to the light source 5, said switch being so operated that when the frequency of the light source 5 is to be changed the switch is opened and the output signal of the reference signal source 4 is changed to set the output frequency of the light source 5 near the desired frequency and then the switch 3 is closed and the light source 5 is finely adjusted.

* * * * *

UNITED STATES PATENT AND TRADEMARK OFFICE
CERTIFICATE OF CORRECTION

PATENT NO. : 5,286,966
DATED : February 15, 1994
INVENTOR(S) : Satoshi Matsuura, et. al.

It is certified that error appears in the above-indentified patent and that said Letters Patent is hereby corrected as shown below:

Title page,
Item [75] --Inventors: Satoshi Matsuura; Tekken Ri, both of Tokyo;
Tsuneo Horiguchi; Mitsuhiro Tateda, both of Mito, all of Japan--

Signed and Sealed this

Twenty-eight Day of March, 1995

Attest:

BRUCE LEHMAN

*Attesting Officer*      *Commissioner of Patents and Trademarks*

UNITED STATES PATENT AND TRADEMARK OFFICE
CERTIFICATE OF CORRECTION

PATENT NO. : 5,286,966
DATED : February 15, 1994
INVENTOR(S) : Satoshi Matsuura et al It is certified that error appears in the above-indentified patent and that said Letters Patent is hereby corrected as shown below:

On the title page, item [73] should read as follows:

--[73] Assignee: Nippon Telegraph and Telephone Corporation, Tokyo Japan--.

Signed and Sealed this

Twentieth Day of June, 1995

Attest:

BRUCE LEHMAN

Attesting Officer

Commissioner of Patents and Trademarks